US008558638B2

(12) United States Patent  
Masuda

(10) Patent No.: US 8,558,638 B2  
(45) Date of Patent: Oct. 15, 2013

(54) IMPEDANCE TRANSFORMER, INTEGRATED CIRCUIT DEVICE, AMPLIFIER, AND COMMUNICATOR MODULE

(75) Inventor: Satoshi Masuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 477 days.

(21) Appl. No.: 13/027,479

(22) Filed: Feb. 15, 2011

(65) Prior Publication Data

US 2011/0204976 A1 Aug. 25, 2011

(30) Foreign Application Priority Data

Feb. 19, 2010 (JP) .................................. 2010-34751

(51) Int. Cl.  
*H03H 7/38* (2006.01)

(52) U.S. Cl.  
USPC .......................................................... 333/33

(58) Field of Classification Search  
USPC .................................................. 333/32, 33  
See application file for complete search history.

(56) References Cited

U.S. PATENT DOCUMENTS

| 5,162,756 A | 11/1992 | Taniguchi et al. |
| 5,274,343 A | 12/1993 | Russell et al. |

FOREIGN PATENT DOCUMENTS

| EP | 0411919 | 2/1991 |
| JP | 5-65104 | 8/1993 |
| JP | 9-139639 | 5/1997 |
| JP | 10-209724 | 8/1998 |

OTHER PUBLICATIONS

Cohn, S.B. "Optimum Design of Stepped Transmission-Line Transformers", IRE trans., MTT-3, Apr. 1, 1955, pp. 16-21.  
Wilkinson, E.J. "An N-Way Hybrid Power Divider", IEEE Trans Microwave Theory and Techniques, vol., MTT-8, Aug. 1, 1960, pp. 116-118.  
Chinese Patent Office Action dated Apr. 23, 2013, from corresponding Chinese Application No. 201110043028.X with English translation.

*Primary Examiner* — Stephen Jones  
(74) *Attorney, Agent, or Firm* — Fujitsu Patent Center

(57) ABSTRACT

An impedance transformer includes a first transmission line having a first impedance and provided over a first substrate having a first permittivity; a second transmission line and a third transmission line having an impedance lower than the first impedance and provided over a second substrate having a permittivity higher than the first permittivity, the second transmission line and the third transmission line being electrically coupled to the first transmission line; and a resistor coupled between the second transmission line and the third transmission line.

15 Claims, 9 Drawing Sheets

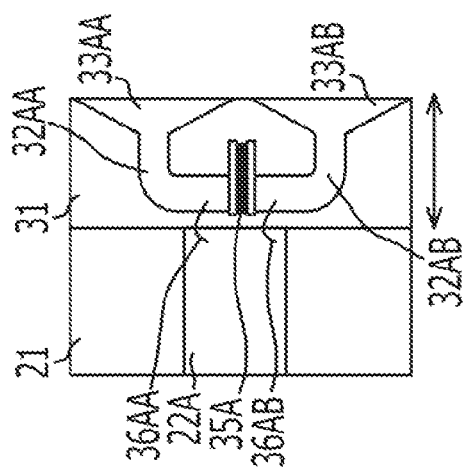
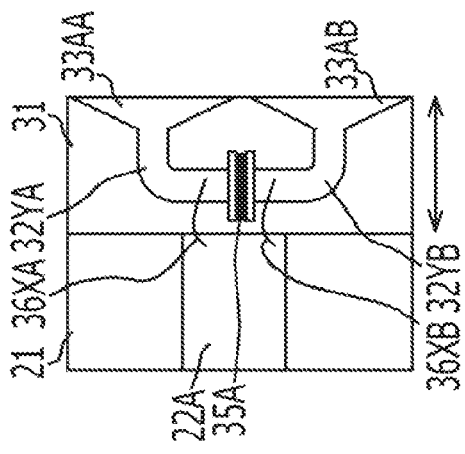
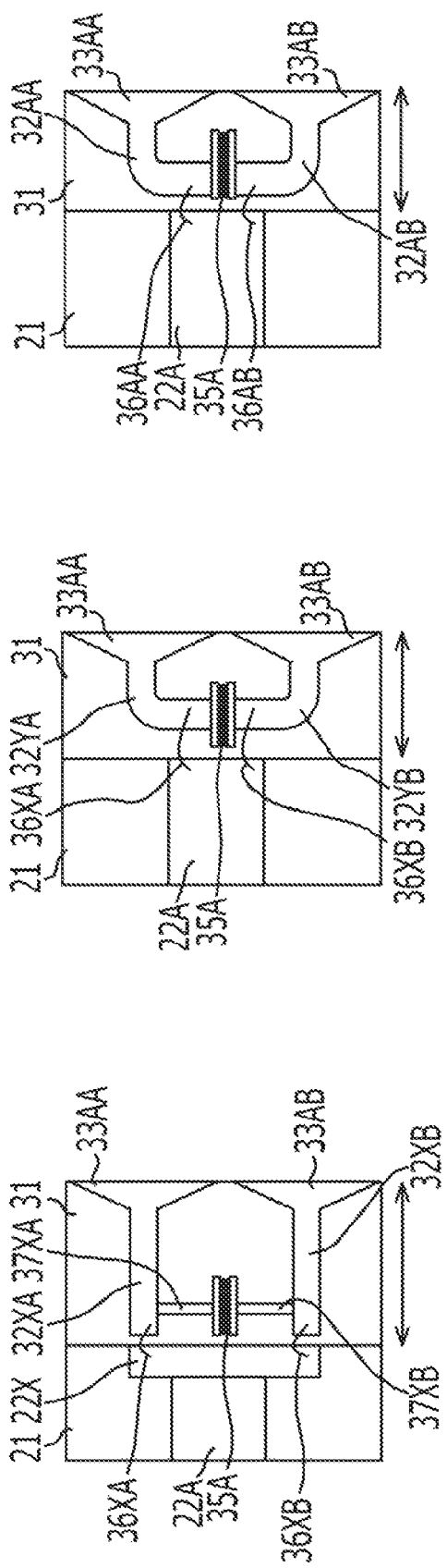
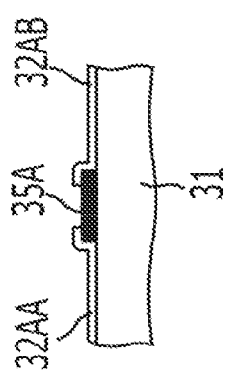

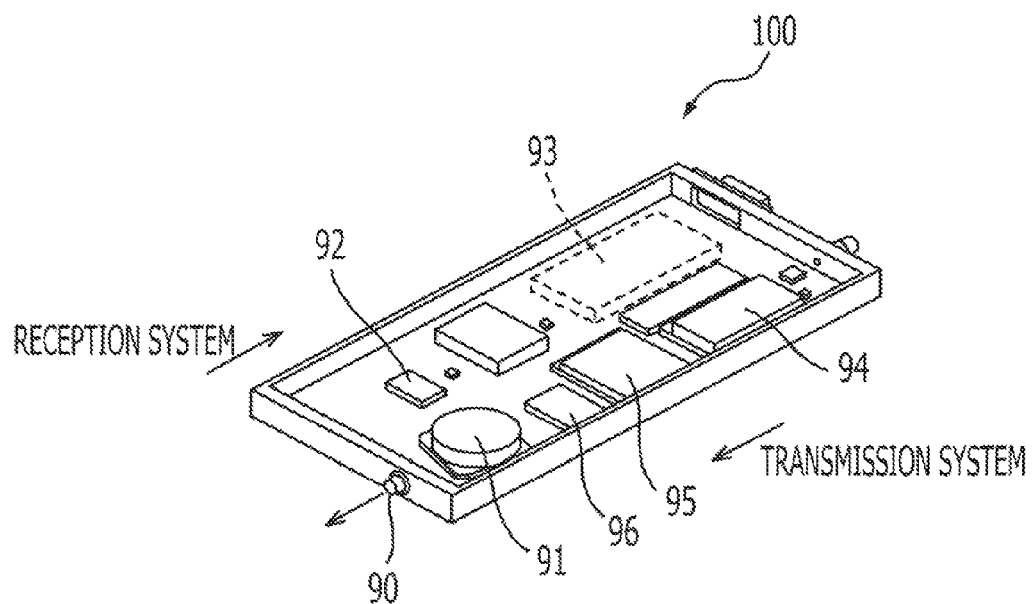

IMPEDANCE TRANSFORMER, INTEGRATED CIRCUIT DEVICE, AMPLIFIER, AND COMMUNICATOR MODULE

CROSS-REFERENCE TO RELATED APPLICATION

The present application is based upon and claims the benefit of priority of the prior Japanese Patent Application No. 2010-34751, filed on Feb. 19, 2010, the entire contents of which are incorporated herein by reference.

FIELD

The embodiments discussed herein relates to an impedance transformer, an integrated circuit device, an amplifier, and a communicator module.

BACKGROUND

In integrated circuit devices used in communicator modules such as radar amplifiers and base station amplifiers, a plurality of integrated circuits, for example, are coupled in parallel and the widths of transistor gates of the integrated circuits are increased to establish a high output.

Furthermore, impedance transformers are coupled to both the input sides and the output sides of the plurality of integrated circuits coupled in parallel to match impedances through matching circuits in the impedance transformers. In particular, impedance transformers with quarter wave-lines coupled in multiple series are widely used in integrated circuit devices needed for wideband characteristics in order to obtain wideband characteristics by increasing the number of quarter wave-line stages.

As related art, for example, Japanese Laid-open Utility Model Registration Publication No. 5-65104, Japanese Laid-open Patent Application Publication No. 9-139639, Japanese Laid-open Patent Application Publication No. 10-209724, S. B. Cohn, "Optimum Design of Stepped Transmission-Line Transformers", IRE trans. MTT-3, pp. 16-21, 1955, and E. J. Wilkinson, "An N-Way Hybrid Power Divider", IEEE Trans Microwave Theory and Techniques, vol. MTT-8, pp. 116-118, 1960 are disclosed.

SUMMARY

According to an aspect of an embodiment, an impedance transformer includes a first transmission line having a first impedance and provided over a first substrate having a first permittivity; a second transmission line and a third transmission line having an impedance lower than the first impedance and provided over a second substrate having a permittivity higher than the first permittivity, the second transmission line and the third transmission line being electrically coupled to the first transmission line; and a resistor coupled between the second transmission line and the third transmission line.

According to another aspect of an embodiment, an integrated circuit device includes a first transmission line having a first impedance and provided over a first substrate having a first permittivity; a second transmission line and a third transmission line having an impedance lower than the first impedance and provided over a second substrate having a permittivity higher than the first permittivity, the second transmission line and the third transmission line being electrically coupled to the first transmission line; a resistor coupled between the second transmission line and the third transmission line; and an integrated circuit coupled electrically to the second transmission line and the third transmission line.

According to another aspect of an embodiment, a communicator module includes an amplifier that amplifies a signal; and a terminal that outputs the signal amplified by the amplifier, wherein the amplifier includes a first transmission line having a first impedance and provided over a first substrate having a first permittivity, a second transmission line and a third transmission line having an impedance lower than the first impedance and provided over a second substrate having a permittivity higher than the first permittivity, the second transmission line and the third transmission line being electrically coupled to the first transmission line, a resistor coupled between the second transmission line and the third transmission line, and an integrated circuit coupled electrically to the second transmission line and the third transmission line.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 3D illustrate details and modifications of coupling portions of the first impedance transformer and the second impedance transformer according to the first embodiment;

FIG. 9 is a perspective view of an example of a communicator module using an integrated circuit device according to the first or second embodiment.

DESCRIPTION OF EMBODIMENTS

Embodiments of the present invention shall be described in detail with reference to the drawings.

A first embodiment will be described with reference to FIG. 1 through 5.

Figure 1:
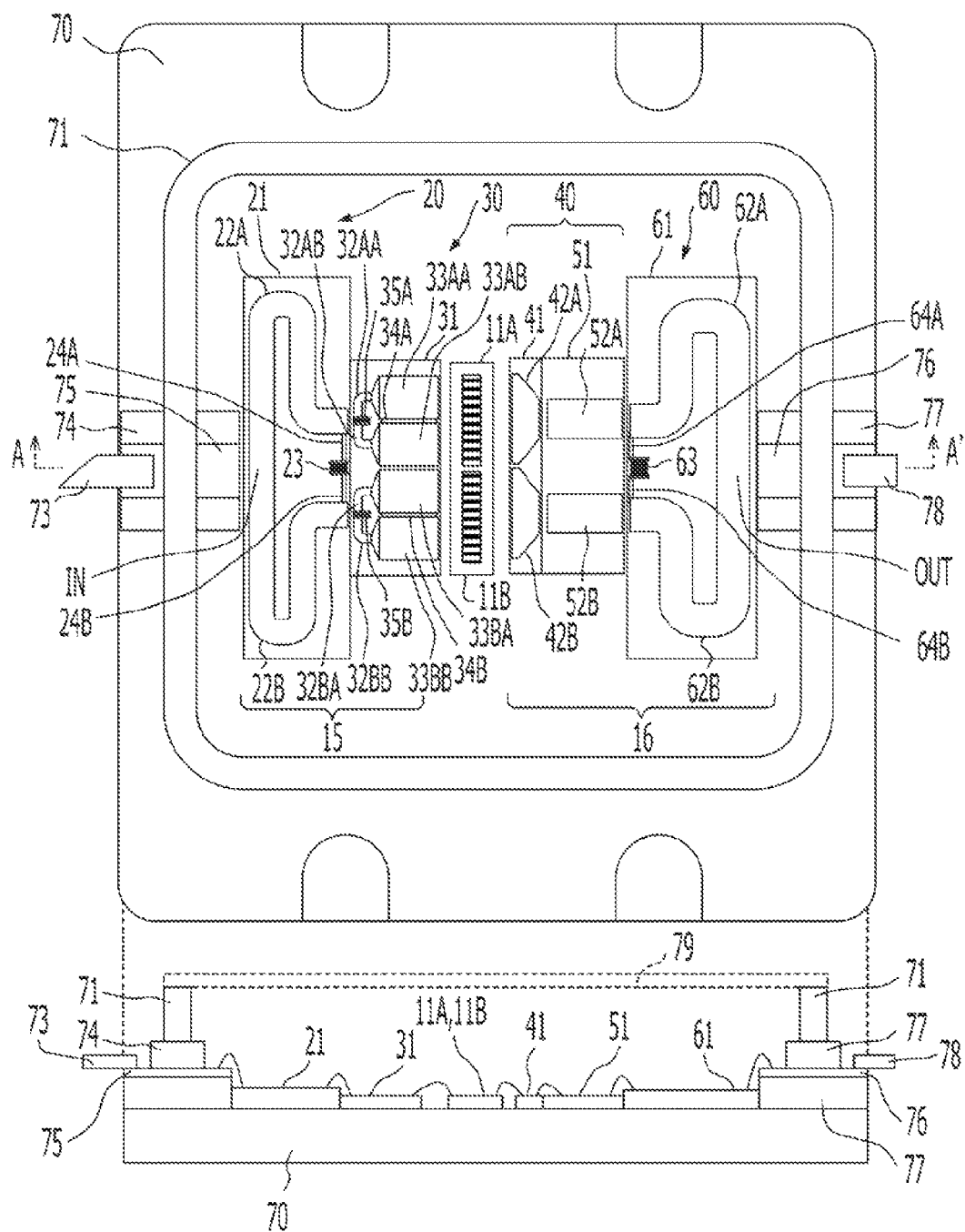
FIG. 1 is a plan view of an example of an integrated circuit device and a cross section view along the center line of the plan view, according to a first embodiment.

FIG. 1 is a plan view of an example of an integrated circuit device and a cross section view along the center line of the plan view, according to the first embodiment. An integrated circuit device according to the first embodiment includes two integrated circuits 11A and 11B each having multiple power transistors, an input distribution circuit 15, and an output synthesis circuit 16 with a tournament-style configuration. The integrated circuit device of the first embodiment amplifies the inputted 2 GHz to 4 GHz high frequency signal to become a large power output. High output is achieved by substantially increasing the transistor gate widths by coupling in parallel a plurality of transistors with approximately the same characteristics, inputting substantially the same signal into the plurality of transistors, and coupling in common the outputs of the plurality of transistors.

Each of the integrated circuits 11A and 11B includes a plurality of GaN high electron mobility transistors (HEMT) having a gate length of about, for example, 0.8 μm.

In FIG. 1, a portion on the left side of the integrated circuits 11A and 11B is the input distribution circuit 15, and a portion on the right side thereof is the output synthesis circuit 16. The input distribution circuit 15 distributes input signals with substantially the same power and phase to each terminal of the integrated circuits 11A and 11B. The output synthesis circuit 16 synthesizes output signals from each terminal of the integrated circuits 11A and 11B into a single output signal with substantially the same phase. Signal distribution and synthesis may be conducted by using, for example, a T-branch.

The input distribution circuit 15 includes a first impedance transformer 20 with a high impedance formed on a substrate 21, and a second impedance transformer 30 with a low impedance formed on a substrate 31. The substrate 21, for example, has a thickness of approximately 0.38 mm and a specific permittivity of 9.8. The substrate 31, for example, has a thickness of approximately 0.25 mm and a specific permittivity of 140. The first impedance transformer 20 and the second impedance transformer 30 each form a quarter wave-line.

The first impedance transformer 20 includes, on the substrate 21, a branch line 22A and a branch line 22B, both of which are bent and formed as microstrip lines having widths of, for example, approximately 0.45 mm. The reason for bent lines is to reduce the dimensions of the lines in the signal advancing direction (the horizontal direction in FIG. 1) and to obtain an integrated circuit device that is reduced in size. When the back surface of a dielectric substrate is grounded and signal lines are formed on the front surface thereof, the microstrip lines are allowed to be designed as microwave and milliwave transmission lines. Microstrip lines formed on substrates with a high specific permittivity have substantially the same advantages.

A resistor 23 is provided on a portion of the substrate 21 toward the substrate 31. Auxiliary lines 24A and 24B that extend from the two branch lines 22A and 22B at the substrate 31 side respectively come in contact with both sides of the resistor 23. As a result, the branch lines 22A and 22B are coupled to each other at the substrate 31 side via the resistor 23.

The second impedance transformer 30 includes, on the substrate 31, four branch lines 32AA, 32AB, 32BA, and 32BB as microstrips formed in a bent shape, and four linear branch lines 33AA, 33AB, 33BA, and 33BB. After extending in a vertical direction as illustrated in FIG. 1, the four branch lines 32AA, 32AB, 32BA, and 32BB bend to extend in a horizontal direction, widen into a tapered shape, and become the four linear branch lines 33AA, 33AB, 33BA, and 33BB. The width of each of the branch lines 32AA, 32AB, 32BA, and 32BB is, for example, approximately 0.2 mm. The width of each of the branch lines 33AA, 33AB, 33BA, and 33BB is, for example, approximately 1.1 mm.

A resistor 35A is provided to allow both ends of the bent branch lines 32AA and 32AB to come into contact. As a result, end portions of the two branch lines 32AA and 32AB are coupled via the resistor 35A. Similarly, a resistor 35B is provided to allow both ends of the bent branch lines 32BA and 32BB to come into contact. As a result, end portions of the two branch lines 32BA and 32BB are coupled via the resistor 35B.

A resistor 34A is provided between the branch lines 33AA and 33AB, and a resistor 34B is provided between the branch lines 33BA and 33BB.

The output synthesis circuit 16 includes two electrodes 42A and 42B formed in a tapered shape on a substrate 41, a third impedance transformer 40 with a low impedance formed on a substrate 51 with a specific permittivity of 140, and a fourth impedance transformer 60 with a high impedance formed on a substrate 61 with a specific permittivity of 9.8. The third impedance transformer 40 includes two linear microstrip lines 52A and 52B formed as microstrip lines on the substrate 51.

The fourth impedance transformer 60 includes, on the substrate 61, a branch line 62A and a branch line 62B, both of which are bent and formed, for example, as microstrip lines. A resistor 63 is provided on a portion of the substrate 61 toward the substrate 51. Auxiliary lines 64A and 64B that extend from the two branch lines 62A and 62B at the substrate 51 side are coupled to both sides of the resistor 63. As a result, the two branch lines 62A and 62B are coupled via the resistor 63 at the substrate 51 side.

The third impedance transformer 40 and the fourth impedance transformer 60 each form a quarter wave-line.

The resistors are, for example, TaN films. After forming a TaN film on the substrate, the resistors are formed so that a portion of the lines covers the TaN film. By using this type of thin film resistor, the resistor dimensions may be smaller and the circuit may be reduced in size. Furthermore, since TaN films are used as resistors, the resistors can cope with high frequency signals and therefore a high quality circuit with superb high temperature operations and long-term reliability may be achieved.

In the input distribution circuit 15, the end portion of the branch line 22A is coupled to the branch lines 32AA and 32AB by, for example, wire bonding and the like. The end portion of the branch line 22B is coupled to the branch lines 32BA and 32BB by, for example, wire bonding and the like. Furthermore, the end portions of the branch lines 33AA, 33AB, 33BA, and 33BB are coupled to input terminals (electrode pads) of the integrated circuits 11A and 11B by, for example, wire bonding and the like.

In the output synthesis circuit 16, output terminals (electrode pads) of the integrated circuits 11A and 11B are coupled to electrodes 42A and 42B by, for example, wire bonding and the like. Electrodes 42A and 42B are coupled to electrodes 52A and 52B by, for example, wire bonding and the like. Electrodes 52A and 52B are coupled to branch lines 62A and 62B by, for example, wire bonding and the like.

Wire bonding may use, for example, a plurality of metal wires with a diameter of 25 μm. Ribbon bonding may also be used instead of wire bonding.

The integrated circuits 11A and 11B, the substrates 21 and 31 forming the input distribution circuit 15, and the substrates 41, 51, and 61 forming the output synthesis circuit 16 are mounted on a package metal base 70 having a metal wall 71 in, for example, an approximately 300 degree Celsius nitrogen atmosphere using AuSn solder. Next, a lid 79 is placed on the metal wall 71 so that the integrated circuits 11A and 11B are hermetically sealed. An electrode 75 and an electrode 76 are provided on the package metal base 70 to allow for an electrical connection to the outside. The electrodes 75 and 76 are electrically isolated from the metal wall 71 and the lid 79 by feedthroughs 74 and 77. An input lead 73 is provided on a portion of the electrode 75 outside the package, and an output lead 78 is provided on a portion of the electrode 76 outside the package.

A portion of the electrode 75 inside the package is coupled to a coupling portion IN of the branch lines 22A and 22B of the first impedance transformer 20 by, for example, wire bonding. A portion of the electrode 76 inside the package is coupled to a coupling portion OUT of the branch lines 62A and 62B of the fourth impedance transformer 60 by, for example, wire bonding.

Figure 2:
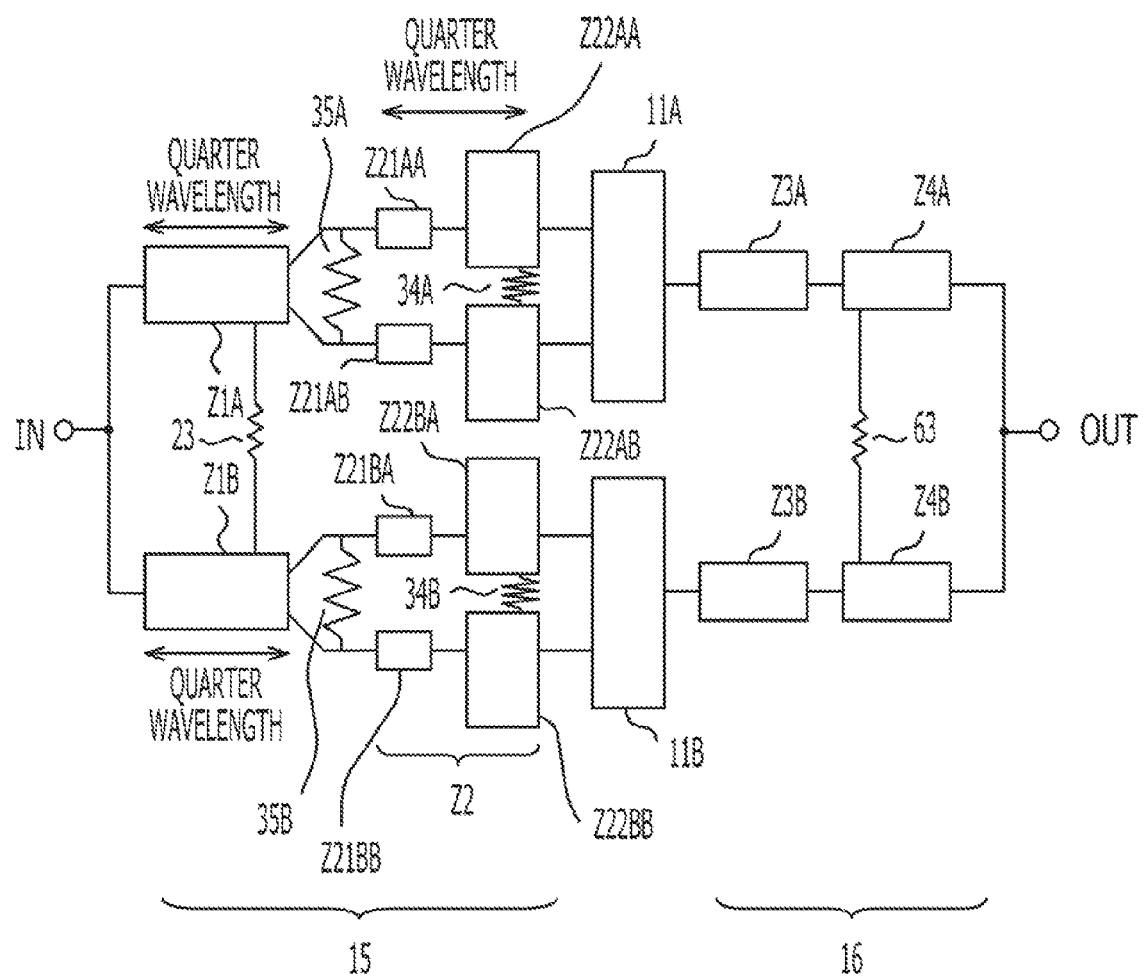
FIG. 2 is an example of an impedance circuit including a first impedance transformer, a second impedance transformer, an integrated circuit, a third impedance transformer, and a fourth impedance transformer according to the first embodiment.

FIG. 2 illustrates an example of an impedance circuit including a first impedance transformer, a second impedance transformer, an integrated circuit, a third impedance transformer, and a fourth impedance transformer according to the first embodiment. A quarter wave-line Z1A and a quarter wave-line Z1B correspond to the two bent branch lines 22A and 22B. Lines Z21AA, Z21AB, Z21BA, and Z21BB correspond to the four bent branch lines 32AA, 32AB, 32BA, and 32BB. Lines Z22AA, Z22AB, Z22BA, and Z22BB correspond to the four bent branch lines 33AA, 33AB, 33BA, and 33BB. Lines Z21AA and Z22AA, lines Z21AB and Z22AB, lines Z21BA and Z22BA, and lines Z21BB and Z22BB each form quarter wave-lines.

Quarter wave-lines Z3A and Z3B correspond to the two linear microstrip lines 52A and 52B. A quarter wave-line Z4A and a quarter wave-line Z4B correspond to the two bent branch lines 62A and 62B.

As described herein, the input distribution circuit 15 forms an impedance transformer that converts 50 ohms to 1 ohm or less as a transmission line having the desired impedance characteristics. As described herein, the output synthesis circuit 16 forms an impedance transformer that converts 1 ohm or less to 50 ohms as a transmission line having the desired impedance characteristics.

FIGS. 3A to 3D illustrate details and modifications of coupling portions of the first impedance transformer 20 and the second impedance transformer 30 according to the first embodiment. FIG. 3C illustrates an example of a coupling portion of the bent branch line 22A and the two bent branch lines 32AA and 32AB. A coupling portion of the bent branch line 22B and the two bent branch lines 32BA and 32BB is substantially the same.

FIG. 3C illustrates an example of the coupling portion of the first impedance transformer 20 and the second impedance transformer 30 according to the first embodiment.

FIG. 3A illustrates a first modification of the coupling portion of the first impedance transformer 20 and the second impedance transformer 30 according to the first embodiment. As illustrated in FIG. 3A, the branch lines corresponding to the branch lines 32AA and 32AB illustrated in FIG. 1 are not bent but linear. An electrode 22X is provided at the end of the branch line 22A to form a T-branch, and both end portions of the electrode 22X are coupled to end portions of linear branch lines 32XA and 32XB with wires 36XA and 36XB. In FIG. 3A, wires 36XA and 36XB are each illustrated as single wires; however multiple wires may be used. Auxiliary lines 37XA and 37XB that extend from near the end portions of branch lines 32XA and 32XB are provided between the branch lines 32XA and 32XB. The auxiliary lines 37XA and 37XB are in contact with the resistor 35A. As a result, the branch lines 32XA and 32XB are coupled to each other via the resistor 35A.

The first modification may also obtain substantially the same effects as the embodiment illustrated in FIG. 3C. However, the portion indicated by the arrow in the first modification is longer than the portion indicated in the embodiment in FIG. 3C since the branch lines 32XA and 32XB are linear and not bent. As a result, the size of the device is increased. Also, in the first modification, the wiring width is not continuous due to the T-branch electrode 22X provided at the end of the branch line 22A. As a result transmission loss is increased.

FIG. 3B illustrates a second modification of the coupling portion of the first impedance transformer 20 and the second impedance transformer 30 according to the first embodiment. In the second modification, branch lines 32YA and 32YB extend toward the center portion of the resistor 35A. The second modification may also obtain substantially the same effects as the embodiment illustrated in FIG. 3C. Conversely, in the embodiment illustrated in FIG. 3C, the branch lines 32AA and 32AB extend to the ends of the resistor 35A on the substrate edge side. When comparing the embodiment illustrated in FIG. 3C and the second modification, since the positions of the branch lines 32AA and 32AB is near the edge of the substrate 31 facing the substrate 21, the length of the portion indicated by the arrow may be made shorter in the embodiment illustrated in FIG. 3C.

FIG. 3D is a cross section of a portion of the resistor 35A. The resistor 35A is, for example, a TaN film. The resistor 35A and the branch lines 32AA and 32AB covering a portion of the resistor 35A are provided on the substrate 31.

Figure 4:
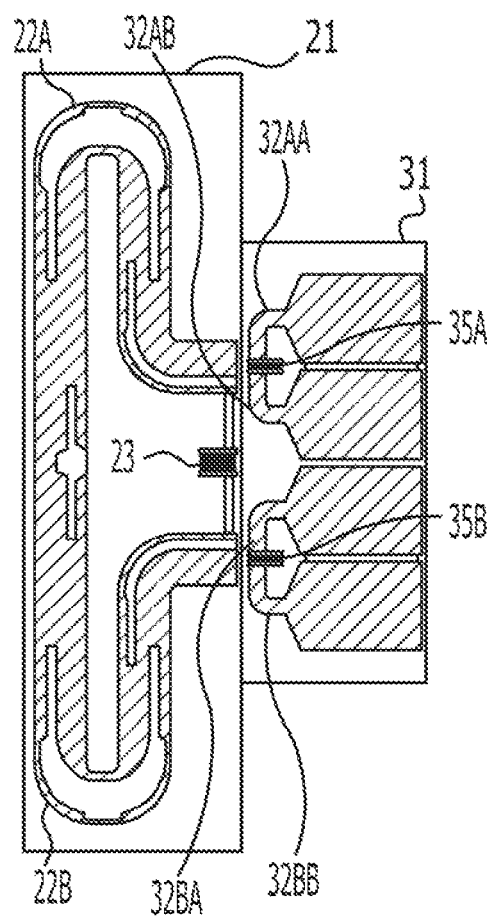
FIG. 4 is an example of high frequency current of an input distribution circuit portion according to the first embodiment.

FIG. 4 is an example of high frequency current of a portion of the input distribution circuit 15 according to the first embodiment. FIG. 4 illustrates a calculated result using an electromagnetic field simulator. The high frequency current flows over the surface of the wiring due to the skin effect. In particular, it may be seen that the current concentrates and flows through both sides of the wiring, in other words both end portions in the width direction of the wiring. By using the bent lines 22A and 22B for wiring on the low permittivity substrate 21, the circuit may be reduced in size. It may be seen that the amount of high frequency current is not the same in the top and bottom of the lines in the width direction at the high permittivity substrate 31 side of the lines 22A and 22B on the low permittivity substrate 21. The difference in the amount of high frequency current indicates that there is a difference in the phase and the size of the signal at the top and bottom of the line in the width direction, and such difference is, in particular, noticeable in the area of electrical discontinuity.

In the first embodiment, the non-uniformity of the amount of current inside the lines at the bent portions is larger since the lines on the low permittivity substrate 21 have a bent shape. The difference in the phase and signal size may affect the phase and the size of the signals distributed to the branch lines 32AA, 32AB, 32BA, and 32BB on the high permittivity substrate 31 since there is signal attenuation due to interference between the branch signals. The performance of the integrated circuits 11A and 11B illustrated in FIG. 1 may not be fully demonstrated. Therefore, controlling the signal attenuation due to interference between the signals outputted from the low-permittivity substrate 21, removing signal components causing the difference in the phase and signal size, and equalizing the phase and signal size are effective.

Therefore, in the first embodiment, as illustrated in FIG. 1, the resistors 35A and 35B are provided to control interference between branch signals in the branch section of the high-permittivity substrate 31 and remove unbalanced behavior. To confirm the effectiveness of the resistors 35A and 35B, the characteristics of amplifiers with and without the resistors 35A and 35B were calculated using an electromagnetic field simulator.

Figure 5:
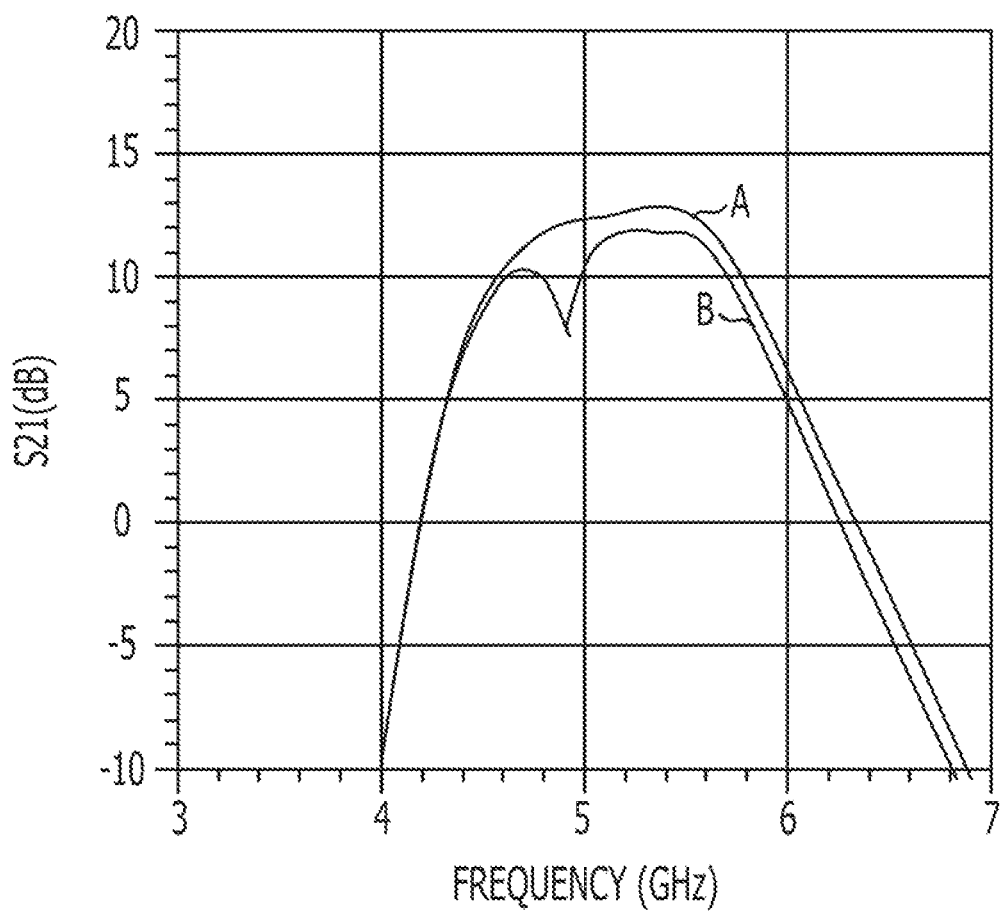
FIG. 5 is a graph of an example of frequency characteristics of an amplification of power gain S21 by the integrated circuit according to the first embodiment.

FIG. 5 is a graph of an example of frequency characteristics of an amplification of a power gain S21 using the integrated circuits 11A and 11B. The line A indicates a case in which the resistors 35A and 35B are provided in the branch section of the high-permittivity substrate 31, and the line B indicates a case in which the resistors 35A and 35B are not provided. In the case in which the resistors 35A and 35B are not provided, the gain quickly drops near the 5 GHz level and thus circuit performance is degraded due to variation of the signal inside the line. On the other hand, when the resistors 35A and 35B are provided, no quick drop of the gain is seen. When compared to the case in which the resistors 35A and 35B are not provided, the total gain of the frequency rises and the frequency band also widens to provide desired characteristics. In this way, circuit performance may be improved by providing the resistors 35A and 35B.

The wires 36XA and 36XB illustrated in FIG. 3B and the wires 36AA and 36AB illustrated in FIG. 3C are preferably coupled to coupling portions provided at the end portion in the width direction of the wires where the current density of the branch line 22A is relatively high. Since the coupling portions are provided at the end portion in the wiring width direction, the high level of current density flowing from the branch line 22A to the wires may be maintained. Accordingly, signal transmission characteristics may be improved.

A second embodiment will be explained with reference to FIG. 6 through 9.

Figure 6:
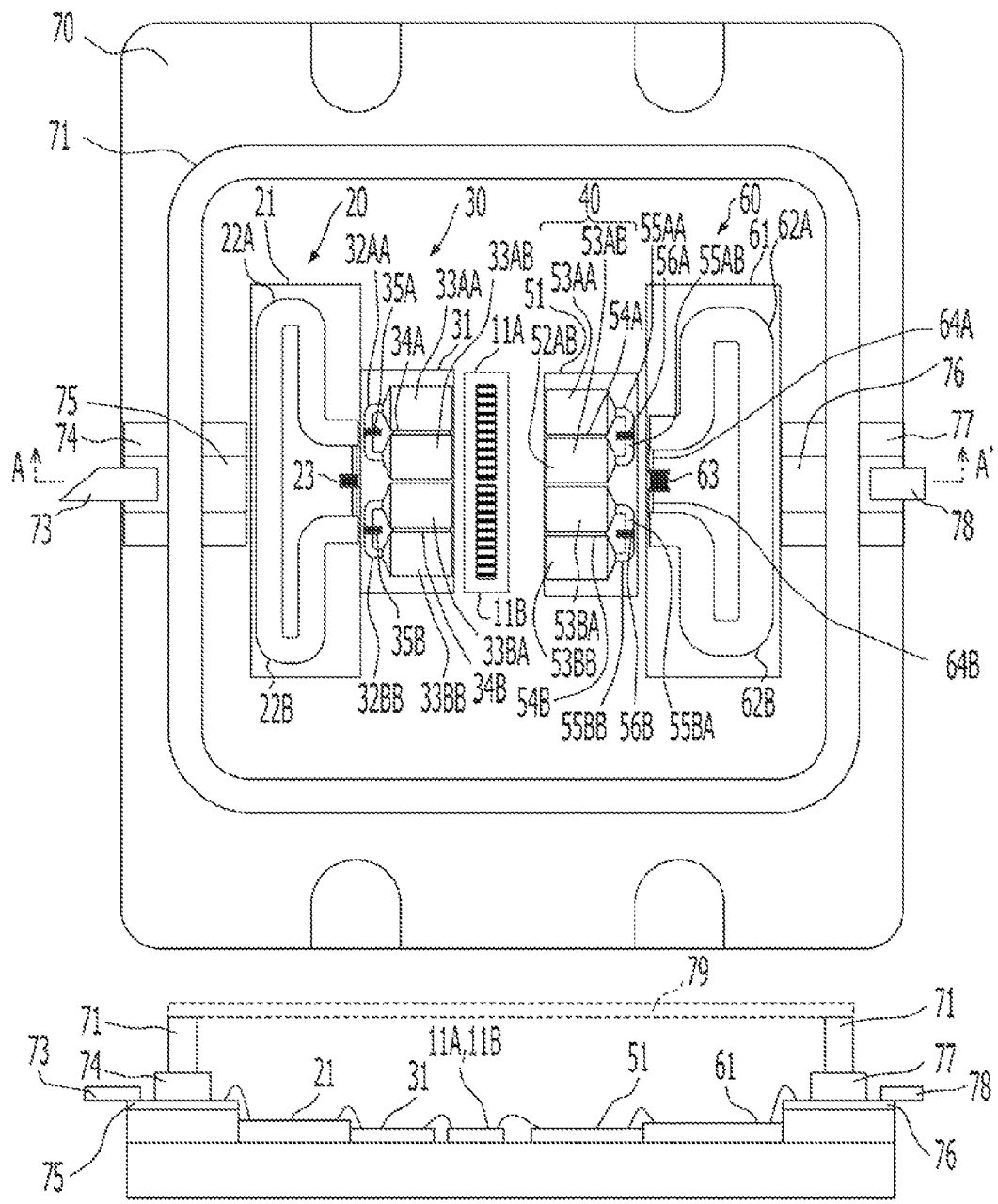
FIG. 6 is a plan view of an example of an integrated circuit device and a cross section view along the center line of the plan view according to a second embodiment.

FIG. 6 is a plan view of an example of an integrated circuit device and a cross section view along the center line of the plan view, according to the second embodiment. The integrated circuit device of the second embodiment is different from the first embodiment in that the output synthesis circuit has four branch lines. However, other portions are substantially the same as the first embodiment.

The output synthesis circuit of the integrated circuit device of the second embodiment includes a third impedance transformer with a low impedance formed on the substrate 51, and a fourth impedance transformer with a high impedance formed on the substrate 61. The substrate 51, for example, has a thickness of approximately 0.25 mm and a specific permittivity of 140. The substrate 61, for example, has a thickness of approximately 0.38 mm and a specific permittivity of 9.8. The third impedance transformer and the fourth impedance transformer each form quarter wave-lines.

The third impedance transformer includes four linear branch lines 53AA, 53AB, 53BA, and 53BB formed as microstrip lines on the substrate 51, and four bent branch lines 55AA, 55AB, 55BA, and 55BB formed on the substrate 51. The four branch lines 53AA, 53AB, 53BA, and 53BB extend in a straight line and then narrow in width to a tapered shape to become the four branch lines 55AA, 55AB, 55BA, and 55BB. The four branch lines 55AA, 55AB, 55BA, and 55BB extend in the lateral direction and then bend and extend in the vertical direction as illustrated in FIG. 6. Branch lines 55AA and 55AB are in contact with resistor 56A. As a result, end portions of the two branch lines 55AA and 55AB are coupled to each other via the resistor 56A. Similarly, branch lines 55BA and 55BB are in contact with resistor 56B. As a result, end portions of the two branch lines 55BA and 55BB are coupled to each other via the resistor 56B. The width of each of the four linear branch lines 53AA, 53AB, 53BA, and 53BB is, for example, approximately 1.1 mm. The width of each of the four bent branch lines 55AA, 55AB, 55BA, and 55BB is, for example, approximately 0.2 mm.

A resistor 54A is provided between branch lines 53AA and 53AB, and a resistor 54B is provided between branch lines 53BA and 53BB.

The fourth impedance transformer includes, on the substrate 61, branch lines 62A and 62B, both of which are bent and formed, for example, as microstrip lines with a width of approximately 0.45 mm. The reason for bent lines is to reduce the width in the signal advancing direction (the horizontal direction in FIG. 6) to reduce an integrated circuit device in size.

A resistor 63 is provided on a portion of the substrate 61 toward the substrate 51. Auxiliary lines 64A and 64B that extend from the two branch lines 62A and 62B at the substrate 51 side are coupled to both sides of the resistor 63. As a result, the branch lines 62A and 62B are coupled to each other at the substrate 51 side via the resistor 63.

As described above, the output synthesis circuit of the integrated circuit device of the second embodiment has substantially the same configuration in reverse as the input distribution circuit of the first embodiment. Therefore, the resistors 54A, 54B, 56A, 56B, and 63 have similar effects and thus their description will be omitted.

Figure 7:
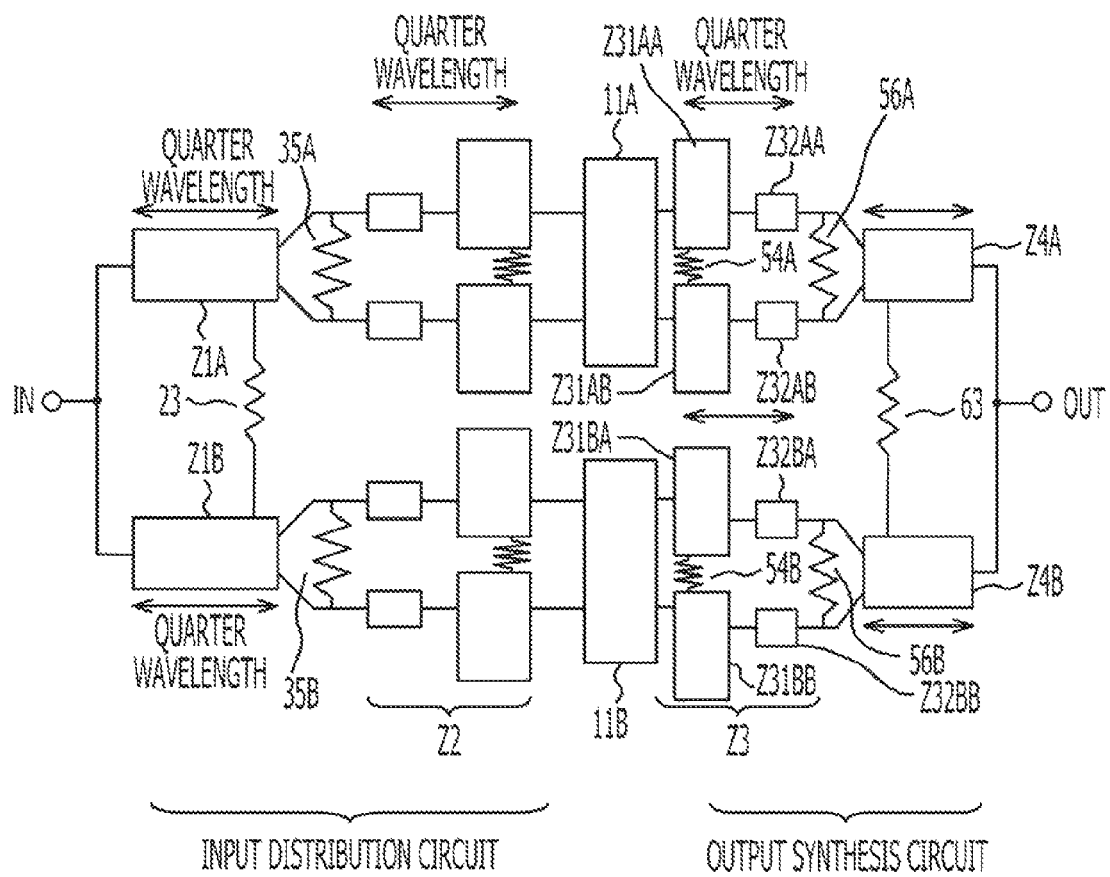
FIG. 7 is an example of an impedance circuit including a first impedance transformer, a second impedance transformer, an integrated circuit, a third impedance transformer, and a fourth impedance transformer according to the second embodiment.

FIG. 7 is an example of an impedance circuit made up of the first impedance transformer, the second impedance transformer, the integrated circuits 11A and 11B, the third impedance transformer, and the fourth impedance transformer according to the second embodiment. The first and second impedance transformers are substantially the same as those in the first embodiment and so their description will be omitted.

Lines Z31AA, Z31AB, Z31BA, and Z31BB correspond to the four linear branch lines 53AA, 53AB, 53BA, and 53BB respectively. Lines Z32AA, Z32AB, Z32BA, and Z32BB correspond to the four bent branch lines 55AA, 55AB, 55BA, and 55BB respectively. The Lines Z31AA and Z32AA, Z31AB and Z32AB, Z31BA and Z32BA, and Z31BB and Z32BB each make up quarter wave-lines. A quarter wave-line Z4A and a quarter wave-line Z4B correspond to the two bent branch lines 62A and 62B.

As described above, the output synthesis circuit forms an impedance transformer that converts 1 ohm or less to 50 ohms as a transmission line having the desired impedance characteristics. In particular, the output synthesis circuit of the second embodiment has lower loss than the output synthesis circuit of the first embodiment.

The first and second embodiments were described above; however various modifications are possible.

Figure 8A:
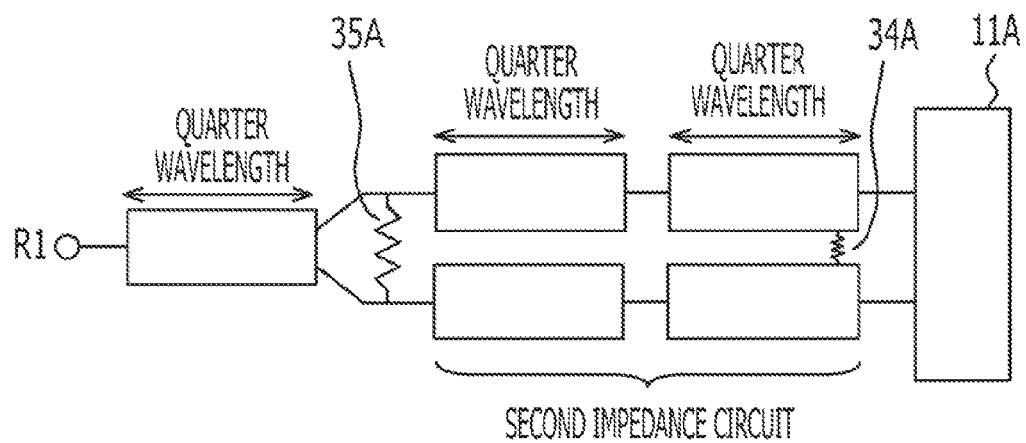
FIGS. 8A and 8B are modifications of the input distribution circuit according to the second embodiment.

For example, FIG. 8A is a first modification of the input distribution circuit according to the second embodiment. FIG. 8A corresponds to the upper half of the input distribution circuit in FIG. 2. In the first embodiment, for example, the lines Z21AA and Z22AA of the second impedance circuit 30 form quarter wave-lines. Conversely, in FIG. 8A, the second impedance circuit includes two serially coupled quarter wave-lines. The resistor 35A is provided at the first impedance circuit side of the branch lines of the second impedance circuit in this case as well. Also, the resistor 34A is provided at the second stage of quarter wave-lines of the second impedance circuit.

Figure 8B:
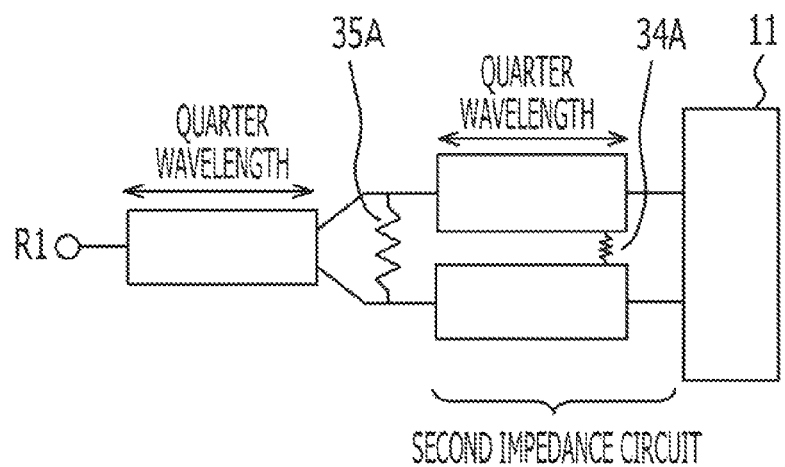

FIG. 8B is a second modification of the input distribution circuit according to the second embodiment. In FIG. 8B, the second impedance circuit includes one quarter wave-line. The resistor 35A is provided at the first impedance circuit side of the branch lines of the second impedance circuit in this case as well. Also, the resistor 34A is provided in the second impedance circuit.

The first and second embodiments are hybrid ICs (HIC) made up of matching circuit substrates and the integrated circuits 11A and 11B that include transistors, for example. However, the first and second embodiments may be applicable to, for example, an MMIC that is the integrated circuits 11A and 11B integrated with a transistor, a resistor, a capacitor, and a transmission line.

For example, an integrated circuit may be formed with a transistor, an NiCr resistor, a metal-insulator-metal (MIM) capacitor with an SiN interlayer, and gold wiring on a substrate including an AlGaN layer and a GaN HEMT layer on an SiC substrate. Matching circuits are formed at the input/output portions of the transistor. The input distribution circuit includes wide low-impedance transmission lines in parallel near the transistors, lines that have relatively high impedance between the signal terminal and the low impedance lines, and has a tournament style configuration suitable for power synthesis. When the NiCr resistor that controls the unbalanced behavior of the branch portions of the parallel lines is inserted, the signal components causing the differences in the phase and size of the signals transmitted from the high impedance transmission line are removed so that the signal size and phase may be equalized. Also, the power distribution to the low impedance transmission lines is uniformalized and a semiconductor circuit with a higher level of performance may be achieved.

The first and second embodiments described above are not limited and many modifications are possible. Although microstrip lines are used in the embodiments, other lines such as, for example, coplanar lines may be used. Also, GaN transistors are provided in the above embodiments; however, other transistors such as, for example, Si, GaAs, or InP transistors may be used.

Furthermore, circuits are made up of transistor chips and matching circuit substrates in the above described embodiments. However, for example, hybrid ICs made up of MMIC chips that partially integrate resistors, capacitors, and matching circuits in the chips and matching circuit substrates outside of MMIC chips may also be used. Also, MMICs that integrate resistors, capacitors, and matching circuits in chips may be used.

In the embodiments, chips and matching circuit substrates are mounted using AuSn solder; however, electrically conductive adhesives may also be used for mounting. In that case, mounting may be conducted at temperatures of 200 degree C. or less which suppresses cracking due to differences in thermal expansion coefficients in the package, chips, matching circuit substrates, and condensers, and thus production yields may be improved. Also, InP devices and the like that have relatively low heat resistance may be mounted without deterioration of characteristics. Furthermore, package materials with excellent heat dissipation performance for large thermal expansion coefficient differences such as copper may be applied to obtain a circuit with higher output, for example. Also, resistors such as, for example, NiCr thin film resistors may be used.

A small semiconductor circuit with higher output, miniaturization, and impedance transformer circuits with low loss may be achieved according to the disclosed embodiments.

As described above, according to the disclosed embodiments, loss in matching circuits that make up a high output semiconductor circuit may be reduced, the circuit area may be reduced, and a high performance high output semiconductor circuit may be achieved.

FIG. 9 is a perspective view of an example of a communicator module 100 using an integrated circuit device according to the first or second embodiment.

As illustrated in FIG. 9, the communicator module 100 includes an input/output terminal 90 coupled to an antenna, a duplexer 91 coupled to the input/output terminal 90, a low noise amplifier 92, a control circuit 93, a pre-amplifier 94, a high output amplifier 95, and a filter 96.

In FIG. 9, the right front row is a transmission system, and the left back side is a reception system. An input signal from the input/output terminal 90 is selectively sent to the low noise amplifier 92 by the duplexer 91 thus performing a reception process. On the other hand, an output signal is amplified by the pre-amplifier 94 and further amplified by the high output amplifier 95, passes through the filter 96, and is selectively sent to the input/output terminal 90 by the duplexer 91, and then outputted from the antenna. The integrated circuit device of the first or second embodiment may be used as the high output amplifier 95. The integrated circuit device of the first or second embodiment may be used not only in a transmission/reception communicator module, but also in a transmission communicator module.

The communicator module 100 illustrated in FIG. 9 may be used, for example, as part of a system apparatus such as a radar device, a sensor, or an electronic wave jammer. Including the high performance integrated circuit device reduced in size according to the first or second embodiment in various types of system apparatuses may contribute to performance improvement and miniaturization of the apparatus.

Although the embodiments of the present application are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. An impedance transformer comprising:
  a first transmission line having a first impedance and provided over a first substrate having a first permittivity;
  a second transmission line and a third transmission line having an impedance lower than the first impedance and provided over a second substrate having a permittivity higher than the first permittivity, the second transmission line and the third transmission line being electrically coupled to the first transmission line; and
  a resistor coupled between the second transmission line and the third transmission line.

2. The impedance transformer according to claim 1 wherein
the first transmission line has a bent shape.
3. The impedance transformer according to claim 1 wherein
the second transmission line includes wires that have a plurality of characteristic impedances and different line widths.
4. The impedance transformer according to claim 1 wherein
the first transmission line and the second transmission line are quarter wave-line transmission lines.
5. The impedance transformer according to claim 1 wherein
the first transmission line and the second transmission line are microstrip lines.
6. An integrated circuit device comprising:
a first transmission line having a first impedance and provided over a first substrate having a first permittivity;
a second transmission line and a third transmission line having an impedance lower than the first impedance and provided over a second substrate having a permittivity higher than the first permittivity, the second transmission line and the third transmission line being electrically coupled to the first transmission line;
a resistor coupled between the second transmission line and the third transmission line; and
an integrated circuit coupled electrically to the second transmission line and the third transmission line.
7. The integrated circuit device according to claim 6 wherein
the first transmission line has a bent shape.
8. The integrated circuit device according to claim 6 wherein
the second transmission line and the third transmission line include wires that have a plurality of characteristic impedances and different line widths.
9. The integrated circuit device according to claim 6 wherein
the first transmission line, the second transmission line, and the third transmission line are quarter wave-line transmission lines.
10. The integrated circuit device according to claim 6 wherein
the first transmission line, the second transmission line, and the third transmission line are microstrip lines.
11. A communicator module comprising:
an amplifier that amplifies a signal; and
a terminal that outputs the signal amplified by the amplifier, wherein the amplifier includes,
a first transmission line having a first impedance and provided over a first substrate having a first permittivity,
a second transmission line and a third transmission line having an impedance lower than the first impedance and provided over a second substrate having a permittivity higher than the first permittivity, the second transmission line and the third transmission line being electrically coupled to the first transmission line,
a resistor coupled between the second transmission line and the third transmission line, and
an integrated circuit coupled electrically to the second transmission line and the third transmission line.
12. The communicator module according to claim 11 wherein
the first transmission line has a bent shape.
13. The communicator module according to claim 11 wherein
the second transmission line and the third transmission line include wires that have a plurality of characteristic impedances and different line widths.
14. The communicator module according to claim 11 wherein
the first transmission line, the second transmission line, and the third transmission line are quarter wave-line transmission lines.
15. The communicator module according to claim 11 wherein
the first transmission line, the second transmission line, and the third transmission line are microstrip lines.

* * * * *